(12) United States Patent
Kojima

(10) Patent No.: US 8,183,893 B2
(45) Date of Patent: May 22, 2012

(54) DRIVER COMPARATOR CIRCUIT

(75) Inventor: Shoji Kojima, Tokyo (JP)

(73) Assignee: Advantest Corporation, Tokyo (JP)

( * ) Notice: Subject to any disclaimer, the term of this patent is extended or adjusted under 35 U.S.C. 154(b) by 213 days.

(21) Appl. No.: 12/764,770

(22) Filed: Apr. 21, 2010

(65) Prior Publication Data

US 2010/0271080 A1    Oct. 28, 2010

(30) Foreign Application Priority Data

Apr. 22, 2009    (JP) .................... PCT/JP2009/001839

(51) Int. Cl.
*H03K 3/00* (2006.01)
(52) U.S. Cl. ......................................... 327/108
(58) Field of Classification Search .................. 327/108
See application file for complete search history.

(56) References Cited

U.S. PATENT DOCUMENTS

| | | | |
|---|---|---|---|
| 3,725,582 A | 4/1973 | Davis ............................ 178/58 |
| 6,133,725 A | 10/2000 | Bowhers .................. 324/158.1 |
| 6,573,764 B1 | 6/2003 | Taylor ........................... 327/108 |
| 6,703,825 B1 | 3/2004 | Creek et al. ............... 324/158.1 |
| 7,190,194 B2 | 3/2007 | Nagahori et al. ............ 327/110 |
| 7,609,097 B2 * | 10/2009 | Leonowich et al. ......... 327/108 |
| 7,696,793 B2 * | 4/2010 | Sunairi ......................... 327/108 |

FOREIGN PATENT DOCUMENTS

| | | |
|---|---|---|
| JP | 52-76812 | 6/1977 |
| JP | 60-42959 | 3/1985 |
| JP | 08-023354 | 1/1996 |
| JP | 2006-023233 | 1/2006 |

OTHER PUBLICATIONS

International Search Report with Written Opinion issued on Jun. 2, 2009 for the corresponding PCT Application No. PCT/JP2009/001839, with its English-language translation.
International Preliminary Report on Patentability with the Written Opinion issued on Jun. 2, 2009 for the corresponding PCT Application No. PCT/JP2009/001839, with English-language translation.

* cited by examiner

*Primary Examiner* — Hai L Nguyen
(74) *Attorney, Agent, or Firm* — Ladas & Parry, LLP

(57) ABSTRACT

A first resistor is arranged such that a first voltage is applied to a first terminal thereof, and a second terminal thereof is connected to an input/output terminal. The first voltage is applied to a first terminal of a second resistor. A tail current source generates a predetermined tail current. A current switch receives data to be transmitted to a second device, selects one from among the second terminals of the first and second resistors, and connects the terminal thus selected to the tail current source. A voltage dividing circuit includes a third resistor and a fourth resistor provided in series between the second terminals of the first resistor and the second resistor. A load balancer includes a fifth resistor arranged such that a second voltage is applied to a first terminal thereof, and a second terminal thereof is connected to the second terminal of the second resistor.

8 Claims, 10 Drawing Sheets

(a)

10a (b)

10b (a)

300

(b)

100

(a)

(b)

(a)

(b)

DRIVER COMPARATOR CIRCUIT

CROSS-REFERENCE TO RELATED APPLICATIONS

This application claims priority to PCT Patent Application No. PCT/JP2009/001839 filed on Apr. 22, 2009, the disclosure of which is incorporated herein by reference in its entirety.

BACKGROUND OF THE INVENTION

1. Field of the Invention

The present invention relates to a driver comparator circuit having a driver function of outputting a signal via a single transmission line, and a comparator function of judging the input signal level.

2. Description of the Related Art

In a case in which data is transmitted and received between two semiconductor devices, in some cases, bidirectional transmission is performed via a single transmission line. In a case in which a device including such a bidirectional interface is tested, the signal output from a device under test (DUT) is compared with a threshold voltage so as to judge the quality of the DUT.

Description will be made regarding a test apparatus which tests a DUT having a bidirectional interface. The test apparatus includes a transmitter (driver) and a receiver (comparator) connected to a common transmission line. The driver transmits a test pattern to the DUT. The comparator judges the logical value of a signal output from the DUT, or checks the amplitude of the signal.

The comparator of the test apparatus is connected to the DUT via the transmission line. Furthermore, the comparator of the test apparatus is connected to the driver on the test apparatus side. Accordingly, there is a need to design such a DUT test apparatus including a bidirectional interface so as to free its comparator from being affected by the output of the driver arranged adjacent to the comparator.

In the most primitive method, the output of the driver is set to a predetermined fixed terminal voltage during a period in which a signal output from the DUT is transmitted via the transmission line, thereby providing the bidirectional transmission. However, such a method has a problem in that, when the signal transmission direction is switched, overhead (which is also referred to as "round trip delay") occurs according to the transmission line time length. With a test apparatus which supplies a very long test pattern to a DUT so as to judge the signal output from the DUT, such a round trip delay leads to a problem of an increased test period. This becomes a cause of reduced throughput.

Such a problem can occur not only in such a test apparatus, but also in bidirectional transmission between semiconductor devices. In this case, such round trip delay becomes a cause of a reduced transmission rate.

In order to solve such a round trip delay problem, various methods have been proposed. For example, Patent documents 1 and 2 disclose a circuit (hybrid circuit) in which, in bidirectional communication, a circuit block cancels the signal it transmits itself so as to receive only a signal output from another circuit block.

RELATED ART DOCUMENTS

Patent Documents

Patent Document 1

Japanese Patent Application Laid Open No. S47-11702

Patent Document 2

U.S. Pat. No. 3,725,582

Patent Document 3

Japanese Patent Application Laid Open No. H08-23354

Patent Document 4

Japanese Patent Application Laid Open No. 2006-23233

Patent Document 5

U.S. Pat. No. 6,573,764 B1

Patent Document 6

U.S. Pat. No. 7,190,194 B2

Patent Document 7

U.S. Pat. No. 6,133,725

Patent Document 8

U.S. Pat. No. 6,703,825

SUMMARY OF THE INVENTION

The present invention has been made in view of such a situation. Accordingly, it is an exemplary purpose of an embodiment of the present invention to provide a driver comparator circuit having a bidirectional interface.

An embodiment of the present invention relates to a driver comparator circuit configured to provide bidirectional signal transmission with a communication target device via a transmission line. The driver comparator circuit includes a voltage dividing circuit and a load balancer, in addition to an input/output terminal connected to the transmission line, a driver amplifier, and a comparator.

The driver amplifier includes: a first resistor arranged such that a first voltage is applied to a first terminal thereof, and a second terminal thereof is connected to the input/output terminal; a second resistor arranged such that the first voltage is applied to a first terminal thereof; a tail current source configured to generate a predetermined tail current; and a current switch configured to receive data to be transmitted to the communication target device, to select one terminal from among the second terminal of the first resistor and a second terminal of the second resistor according to the value of the data thus received, and to connect the second terminal thus selected to the tail current source. The voltage dividing circuit includes a third resistor and a fourth resistor provided in series between the second terminal of the first resistor and the second ond terminal of the second resistor. The load balancer includes a fifth resistor arranged such that a second voltage is applied to a first terminal thereof, and a second terminal thereof is connected to the second terminal of the second resistor. The comparator compares the electric potential at a connection node that connects the third and fourth resistors with a predetermined first threshold voltage.

With such an embodiment, the voltage at the second terminal of the first resistor and the voltage at the second terminal of the second resistor are switched in reverse phase. By dividing the voltage difference between these voltages by means of the third and fourth resistors, such an arrangement is capable of canceling out the signal component transmitted by the driver amplifier to the communication target device. This enables the comparator to compare the signal component transmitted from the communication target device with a threshold voltage. Furthermore, by providing a fifth resistor, such an arrangement is capable of balancing the voltage amplitude at the second terminal of the first resistor and the voltage amplitude at the second terminal of the second resistor.

Another embodiment of the present invention relates to a test apparatus configured to provide bidirectional signal transmission with a device under test (DUT) via a transmission line so as to test the device under test. The test apparatus includes the above-described driver comparator circuit configured to communicate with the device under test as a communication target.

With such an embodiment, only the signal component received from the DUT is compared with the threshold voltage. This reduces the effects of round trip delay, thereby reducing the testing time.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not affect the electric connection therebetween, in addition to a state in which the member A is physically and directly connected to the member B. Similarly, the state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

Figure 1:
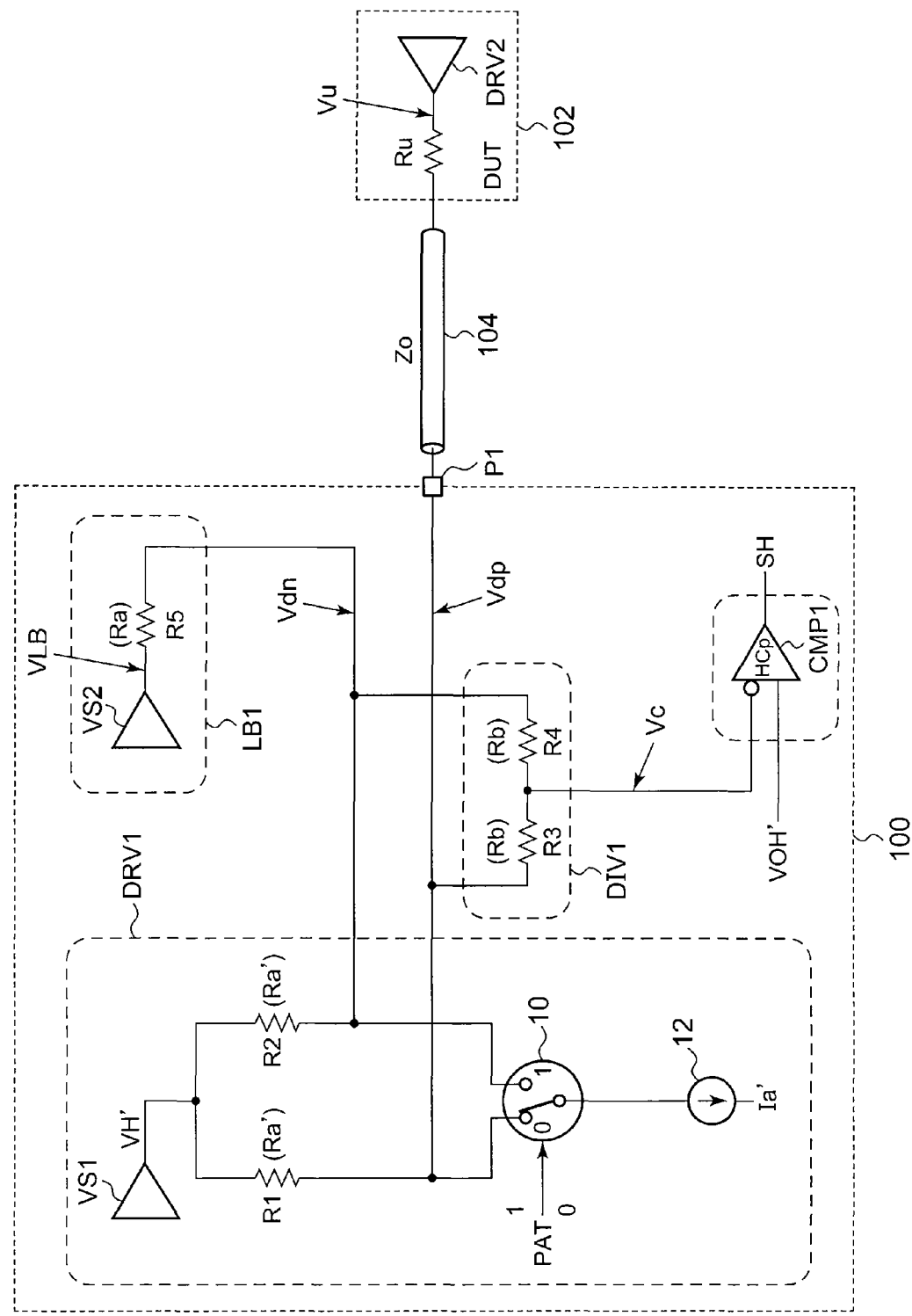
FIG. 1 is a circuit diagram which shows a configuration of a driver comparator circuit according to an embodiment.

An embodiment described below relates to a driver comparator circuit having a bidirectional interface. FIG. 1 is a circuit diagram which shows a configuration of a driver comparator circuit 100 according to an embodiment.

The driver comparator circuit 100 is an interface circuit for a first device. The driver comparator circuit 100 is connected via a transmission line 104 to a device (which will be referred to as the "second device" hereafter) 102 with which the driver comparator circuit 100 is to communicate. The driver comparator circuit 100 outputs a signal Vdp to the second device 102, or receives a signal Vu output from the second device 102.

Alternatively, the driver comparator circuit 100 is preferably employed as an interface circuit for an automatic test equipment ATE (which will also be referred to as "pin electronics"). That is to say, the driver comparator circuit 100 outputs pattern data to the second device (DUT), and receives a signal output from the DUT so as to judge the amplitude (level) of the signal thus received.

The second device 102 includes a driver amplifier DRV2 and an output resistor Ru. A signal Vu output from the driver amplifier DRV2 is input to an input/output terminal P1 of the driver comparator circuit 100 via the transmission line 104. The output resistor Ru is provided to the driver amplifier DRV2. Description will be made below under the assumption that impedance matching is achieved between the characteristic impedance Zo of the transmission line 104 and the output resistor Ru included in the second device 102.

The driver comparator circuit 100 includes an input/output terminal P1 which allows the transmission line 104 to be connected. Furthermore, the driver comparator circuit 100 includes a driver amplifier DRV1, a load balancer LB1, a voltage dividing circuit DIV1, and a comparator CMP1.

The driver amplifier DRV1 is a CML (Current Mode Logic) driver which can be suitably applied to high-speed data transmission, and includes a first voltage source VS1, a first resistor R1, a second resistor R2, a current switch 10, and a tail current source 12.

The first voltage source VS1 generates a first voltage VH'. The first voltage VH' may be the power supply voltage. Also, the first voltage VH' may be a desired voltage.

The first resistor R1 is arranged such that the first voltage VH' is applied to one terminal (first terminal) thereof on the higher electric potential side, and such that the other terminal (second terminal) thereof on the lower electric potential side is connected to the input/output terminal P1. The second resistor R2 is arranged such that the first voltage VH' is applied to one terminal (first terminal) thereof on the higher electric potential side. The first resistor R1 and the second resistor R2 each have the same resistance value, which will be represented by "Ra'". The tail current source 12 generates a predetermined tail current Ia'. The current switch 10 receives pattern data PAT to be transmitted to the second device 102, selects one of either the second terminal of the first resistor R1 or the second terminal of the second resistor R2, and connects the second terminal thus selected to the tail current source 12.

With the driver amplifier DRV1, when PAT=1, the tail current Ia' flows through the second resistor R2 side, which sets the voltage Vdp at the second terminal of the first resistor R1 to a voltage that corresponds to the high level, and when PAT=0, the tail current Ia' flows through the first resistor R1 side, which sets the voltage Vdp to a voltage that corresponds to the low level.

Figure 2:
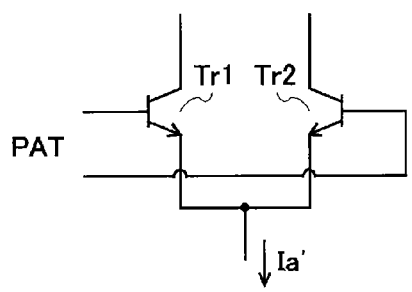
FIGS. 2A and 2B are circuit diagrams which each show an example configuration of a current switch shown in FIG. 1.
Figure 2:
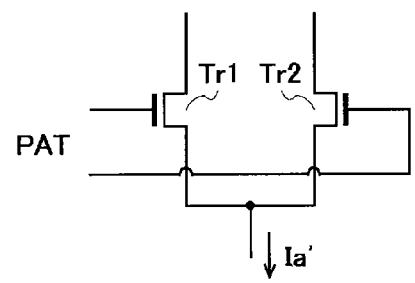

FIGS. 2A and 2B are circuit diagrams which each show an example configuration of the current switch 10 shown in FIG. 1. Current switches 10a and 10b shown in FIGS. 2A and 2B each include a first transistor Tr1 and a second transistor Tr2. The transistors Tr1 and Tr2 shown in FIG. 2A are each configured as NPN bipolar transistors. The first terminal (collector) of the first transistor Tr1 is pulled up to the first voltage VH' via the first resistor R1. The first terminal (collector) of the second transistor Tr2 is pulled up to the first voltage VH' via the second resistor R2. The second terminals (emitters) of the first transistor Tr1 and the second transistor Tr2 are connected so as to form a common terminal, which is connected to the tail current source 12 which supplies the tail current Ia'. The pattern data PAT is input to each control terminal (base) of the first transistor Tr1 and the second transistor Tr2.

The current switch 10b shown in FIG. 2B has a configuration obtained by replacing the transistors Tr1 and Tr2 with N-channel MOSFETs. The first terminal, the second terminal, and the control terminal correspond to the drain, the source, and the gate, respectively.

It should be noted that the configuration of the current switch 10 is not restricted to such transistor pairs shown in FIGS. 2A and 2B. Also, switching devices other than the transistors may be employed.

Returning to FIG. 1, the voltage dividing circuit DIV1 includes a third resistor R3 and a fourth resistor R4 provided in series in this order between the second terminal of the first resistor R1 and the second terminal of the second resistor R2. The voltage dividing circuit DIV1 divides the voltage difference between the voltage Vdp at the second terminal of the first resistor R1 and the voltage Vdn at the second terminal of the second resistor R2. The third resistor R3 and the fourth resistor R4 may each have the same resistance value. The resistance value of each of these two resistors will be represented by "Rb" hereafter.

The resistance value Rb of each of the third resistor R3 and the fourth resistor R4 can be determined as desired. However, the resistance value Rb is set to a sufficiently large value as compared with the resistance value Ra of a fifth resistor R5. For example, the resistance value Rb is preferably set to a large value which is several tens of times (ten to one hundred times) greater than the resistance value Ra of the fifth resistor R5. Such an arrangement suppresses the effect of the voltage dividing circuit DIV1 on the output signal Vdp of the driver amplifier DRV1.

Together with the input capacitance of the comparator CMP1, the third resistor R3 and the fourth resistor R4 form a low-pass filter. Accordingly, if the resistance value Rb is excessively large, the responsiveness of the comparator CMP1 is degraded.

As realistic exemplary values, Ra and Rb may be set to 50Ω, and 1 kΩ, respectively.

The load balancer LB1 is provided in order to balance the impedance component connected to the second terminal of the first resistor R1 and the impedance component connected to the second terminal of the second resistor R2. Specifically, the load balancer LB1 includes a second voltage source VS2 and the fifth resistor R5. The second voltage source VS2 generates a predetermined second voltage VLB. The second voltage VLB is applied to one terminal (first terminal) on the high electric potential side of the fifth resistor R5. Furthermore, the other terminal (second terminal) on the low potential side thereof is connected to the second terminal of the second resistor R2.

For example, the second voltage VLB may be set to a desired constant voltage. However, the second voltage VLB is preferably set to a value in the vicinity of the average of the voltage output from the second device 102. Such an arrangement provides a suitable balance between the differential voltage components Vdp and Vdn in the driver amplifier DRV1.

The comparator CMP1 compares the output voltage of the voltage dividing circuit DIV1, i.e., the voltage Vc at the connection node that connects the third resistor R3 and the fourth resistor R4, with a predetermined first threshold voltage VOH'.

The above is the basic configuration of the driver comparator circuit 100. Next, description will be made regarding the operation of the driver comparator circuit 100.

The voltage Vdp at the second terminal of the first resistor R1 and the voltage Vdn at the second terminal of the second resistor R2 are switched in reverse phase, according to the pattern data PAT. Directing our attention to the output voltage Vc of the voltage dividing circuit DIV1, the output voltage Vc is a voltage obtained by dividing the voltage difference between two voltages Vdp and Vdn. Thus, the voltage component that varies in response to the pattern data PAT is partially or completely canceled out. Thus, the comparator CMP1 is capable of comparing the signal component transmitted by the second device 102 with the threshold voltage VOH' in a state in which the signal is partially or completely free of the effects of the signal component transmitted from the driver amplifier DRV1 to the second device 102.

If the load balancer LB1 were not provided, the amplitude of the voltage Vdn would become approximately double the amplitude of the voltage Vdp, and the signal component transmitted by the driver amplifier DRV1 could not be canceled out, even by the voltage dividing operation performed by the voltage dividing circuit DIV1. By providing the load balancer LB1, such an arrangement is capable of adjusting the amplitudes of the differential voltages Vdp and Vdn such that they become uniform.

Figure 3:
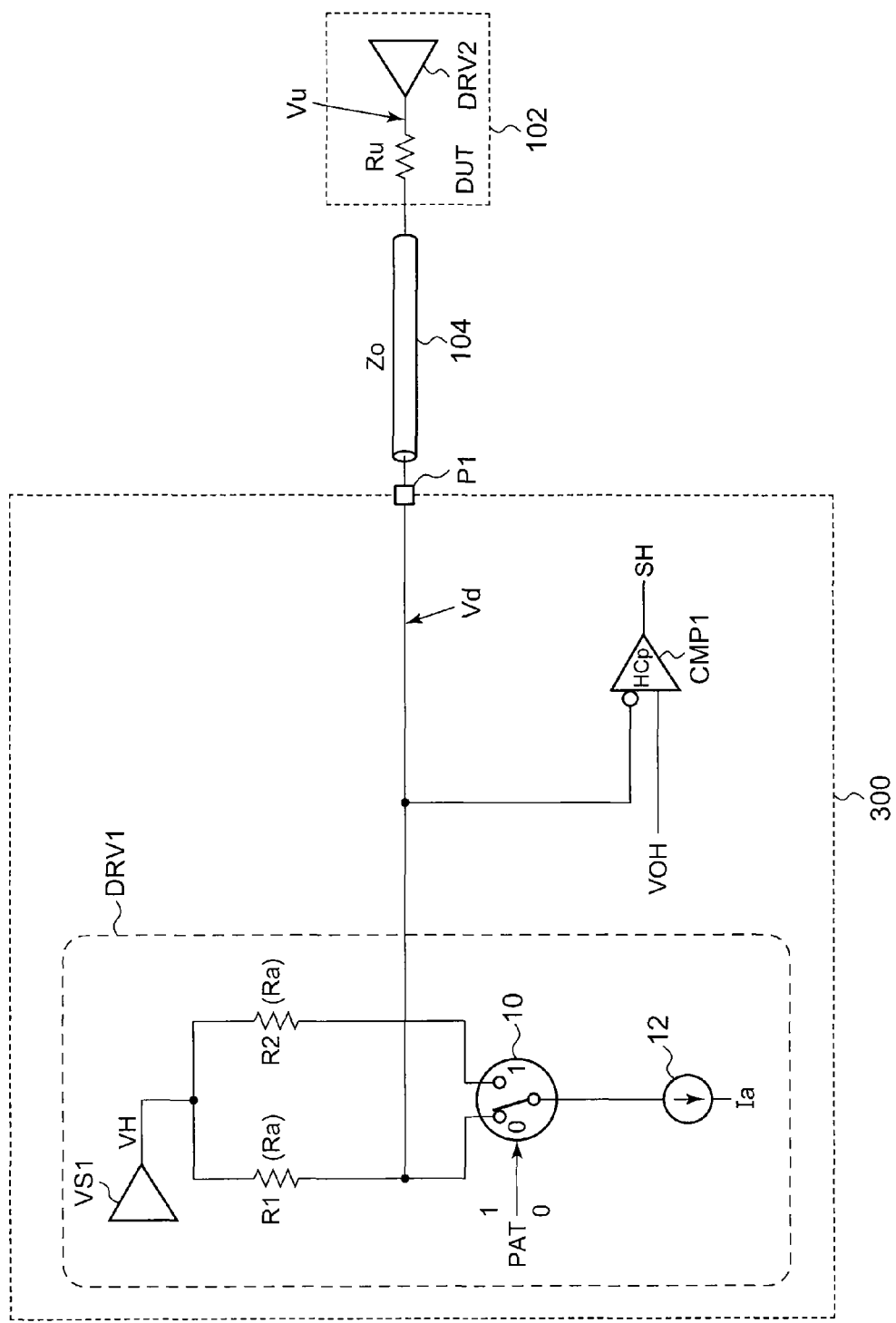
FIG. 3 is a circuit diagram which shows a basic configuration of the driver comparator circuit.

The advantage of the driver comparator circuit 100 shown in FIG. 1 can be more clearly understood in comparison with a driver comparator circuit 300 shown in FIG. 3. FIG. 3 is a circuit diagram which shows a basic configuration of the driver comparator circuit 300. The driver comparator circuit 300 shown in FIG. 3 has a configuration obtained by eliminating the voltage dividing circuit DIV1 and the load balancer LB1 from the configuration of the driver comparator circuit 100 shown in FIG. 1.

Description will be made regarding the behavior of the driver comparator circuit 300 shown in FIG. 3. Let us say that impedance matching is achieved between the driver comparator circuit 300, the second device 102, and the transmission line 104. That is to say, the following relation is satisfied.

$$Ra = Zo = Ru \quad (A)$$

With the driver comparator circuit 300 shown in FIG. 3, if the delay time due to the transmission line 104 is disregarded, the input voltage Vd of the comparator CMP1 is represented by the following Expression (1a). Applying Expression (A) to Expression (1a), the following Expression (1b) is obtained.

$$Vd = \frac{VH \cdot Ru + Vu \cdot Ra}{Ra + Ru} - \frac{Ra \cdot Ru}{Ra + Ru} \cdot Ia \cdot (1 - PAT) \quad (1a)$$

$$Vd = \frac{VH + Vu}{2} - \frac{Ra}{2} \cdot Ia \cdot (1 - PAT) \quad (1b)$$

The comparator CMP1 compares the voltage Vd with a threshold voltage VOH. When Vd>VOH, the comparator CMP1 generates a judgment signal SH at a low level, and when Vd<VOH, the comparator CMP1 generates the judgment signal SH at a high level. As can be clearly understood from Expression (1b), the voltage Vd input to the comparator CMP1 is obtained by combining the pattern data PAT output from the driver DRV1 and the output voltage Vu of the second device 102.

This means that, where the driver amplifier DRV1 outputs a signal when the second device 102 outputs a signal, the output signal thus output from the driver amplifier DRV1 has an effect on the judgment result made by the comparator CMP1, i.e., comparison result of whether the voltage Vc is a high level signal or a low level signal.

On the other hand, the driver comparator circuit 100 shown in FIG. 1 is capable of reducing or eliminating the effect of the pattern data PAT on the voltage Vc input to the comparator CMP1, as described later in detail.

Description will be made below regarding a design method for designing each voltage and each resistance value for the driver comparator circuit 100. The design approach is to make the characteristics of the driver comparator circuit 100 shown in FIG. 1 match the characteristics of the driver comparator circuit 300 shown in FIG. 3.

[First Requirement]

The first requirement is that the internal impedance Z1 of the driver comparator circuit 100 shown in FIG. 1 measured via the input/output terminal P1 thereof be equal to the internal impedance Z2 of the driver comparator circuit 300 shown in FIG. 3 measured via the input/output terminal P1 thereof.

Figure 4:
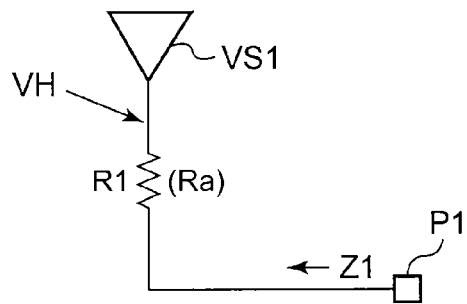
FIGS. 4A and 4B are circuit diagrams which respectively show the configuration of the driver comparator circuit shown in FIG. 3 and the configuration of the driver comparator circuit shown in FIG. 1, with only the circuit components that relate to the impedance extracted.
Figure 4:
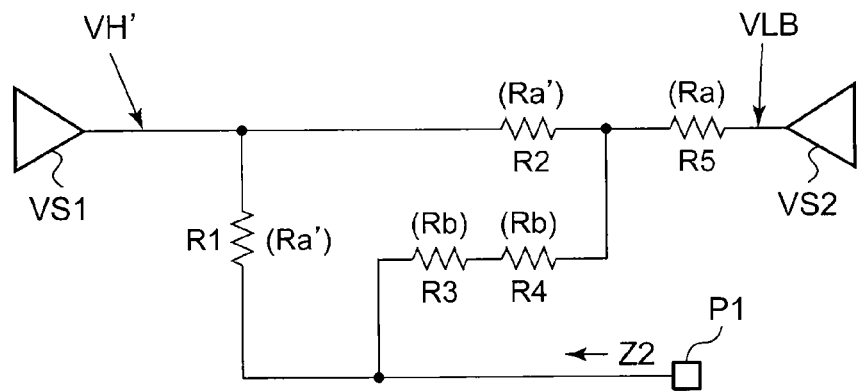

FIGS. 4A and 4B are circuit diagrams which respectively show the configuration of the driver comparator circuit 300 shown in FIG. 3 and the configuration of the driver comparator circuit 100 shown in FIG. 1, with only the circuit components that relate to the impedance extracted.

For the two impedances Z1 and Z2 to become equal, the following relation must be satisfied.

$$Ra = Ra'//(2 \times Rb + Ra'/Ra') \quad (2)$$

Here, the symbol "//" represents the combined resistance value of resistors connected in parallel. That is to say, "//" is an operator represented by the following Expression.

$$A//B = A \times B/(A + B)$$

Furthermore, this operator is associative. That is to say, the following Expression is satisfied.

$$A//(B//C) = (A//B)//C$$

Expression (2) is solved for Ra', thereby obtaining the following Expression (3).

$$Ra' = \frac{Ra}{2} \cdot \left( \frac{Ra}{Rb} + \sqrt{\frac{Ra^2}{Rb^2} + 4} \right) \quad (3)$$

The resistance value Ra of the first resistor R1 of the driver/comparator circuit 300 and the resistance value Ra of the fifth resistor R5 of the driver comparator circuit 100 each must be the same as the characteristic impedance of the transmission line 104. Accordingly, if the resistance value Rb of the voltage dividing circuit DIV1 is determined, the resistance value Ra' of the first resistor R1 and the second resistor R2 can be determined. Alternatively, Rb may be determined such that Expression (3) is satisfied after Ra' is determined.

If Expression (3) is satisfied, impedance matching has been achieved between the driver comparator circuit 100, the second device 102, and the transmission line 104, thereby suppressing signal reflection.

[Second requirement] The second requirement is that the voltage level of the signal Vd output from the input/output terminal P1 of the driver comparator circuit 300 shown in FIG. 3 be equal to the voltage level of the signal Vdp output from the input/output terminal P1 of the driver comparator circuit 100 shown in FIG. 1.

Figure 5:
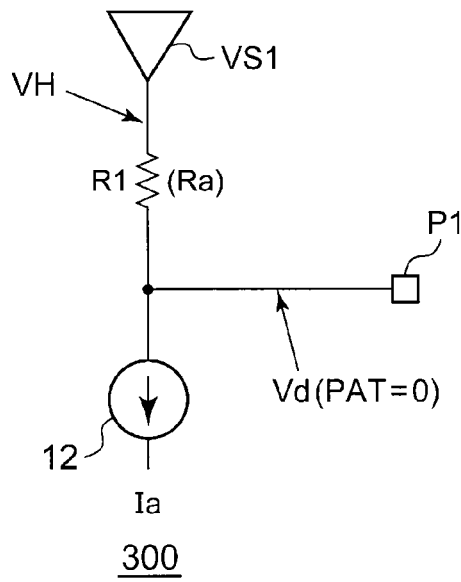
FIGS. 5A and 5B are circuit diagrams which respectively show the configuration of the driver comparator circuit shown in FIG. 3 and the configuration of the driver comparator circuit shown in FIG. 1, with only the circuit components that relate to the voltage extracted.
Figure 5:
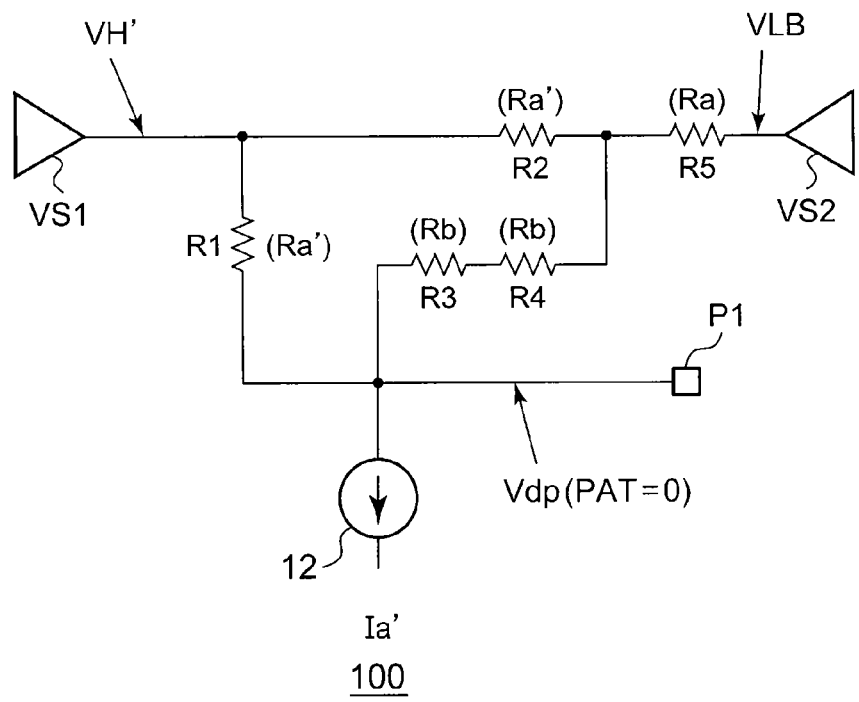

FIGS. 5A and 5B are circuit diagrams which respectively show the configuration of the driver comparator circuit 300 shown in FIG. 3 and the configuration of the driver comparator circuit 100 shown in FIG. 1, with only the circuit components that relate to the voltage Vd or Vdp extracted. FIGS. 5A and 5B each show the state when PAT=0.

The following Expression (4) is obtained from FIG. 5A. Furthermore, the following Expression (5) is obtained from FIG. 5B.

$$Vd = VH - Ra \cdot Ia \quad (4)$$

$$Vdp = \frac{VH'\left(\frac{Ra'//Ra+}{2 \cdot Rb}\right) + \frac{VH' \cdot Ra+}{Ra + Ra'} \cdot Ra'}{Ra' + Ra'//Ra + 2 \cdot Rb} - Ia' \cdot Ra \quad (5)$$

In order to ensure that the circuit shown in FIG. 5A and the circuit shown in FIG. 5B are equivalent, the relation Vd=Vdp should be satisfied. An equation is constructed using Expression (5), thereby obtaining the following Expression (6).

$$VH' \cdot \alpha_0 - Ia' \cdot \beta_0 = \gamma_0 \quad (6)$$

$$\alpha_0 = \frac{2 \cdot Rb \cdot (Ra + Ra') + 2 \cdot Ra \cdot Ra'}{(Ra' + 2 \cdot Rb) \cdot (Ra + Ra') + Ra \cdot Ra'}$$

$$\beta_0 = Ra$$

$$\gamma_0 = VH - Ra \cdot Ia - \frac{VLB \cdot Ra'^2}{(Ra' + 2 \cdot Rb) \cdot (Ra + Ra') + Ra' \cdot Ra}$$

Figure 6:
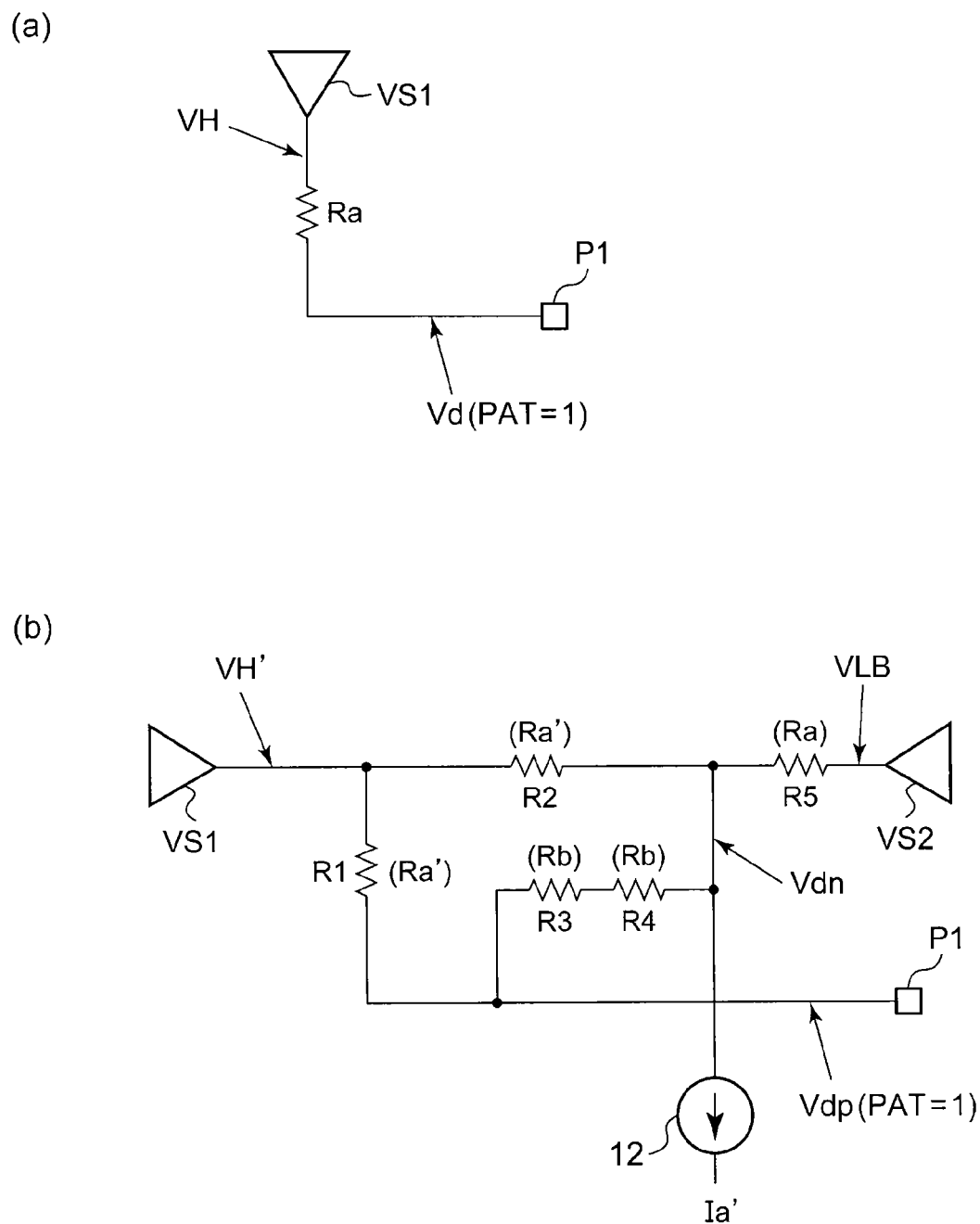
FIGS. 6A and 6B are circuit diagrams which respectively show the configuration of the driver comparator circuit shown in FIG. 3 and the configuration of the driver comparator circuit shown in FIG. 1, with only the circuit components that relate to the voltage extracted.

Next, let us consider a case in which PAT=1. FIGS. 6A and 6B are circuit diagrams which respectively show the configuration of the driver comparator circuit 300 shown in FIG. 3 and the configuration of the driver comparator circuit 100 shown in FIG. 1, with only the circuit components that relate to the voltage Vd or Vdp extracted.

The following Expression (7) is obtained from FIG. 6A. Furthermore, The following Expressions (8a) and (8b) are obtained from FIG. 6B.

$$Vd = VH \tag{7}$$

$$Vdn = \frac{VH' \cdot Ra + VLB \cdot \left( \frac{Ra' \; //}{(Ra' + 2 \cdot Rb)} \right)}{Ra + Ra' \; // \; (Ra' + 2 \cdot Rb)} - Ia' \cdot (Ra' \; // \; Ra \; // \; (Ra' + 2 \cdot Rb)) \tag{8a}$$

$$Vdp = \frac{Vdn \cdot Ra' + VH' \cdot 2 \cdot Rb}{Ra' + 2 \cdot Rb} \tag{8b}$$

In order to ensure that the circuit shown in FIG. 6A and the circuit shown in FIG. 6B are equivalent, the relation Vd=Vdp should be satisfied. An equation is constructed using Expressions (8a) and (8b), thereby obtaining the following Expression (9).

$$VH' \cdot \alpha_1 - Ia' \cdot \beta_1 = \gamma_1 \tag{9}$$

$$\alpha_1 = \frac{\frac{Ra \cdot Ra'}{Ra + Ra' \; // \; (Ra' + 2 \cdot Rb)} + 2 \cdot Rb}{Ra' + 2 \cdot Rb}$$

$$\beta_1 = \frac{Ra' \cdot (Ra' \; // \; Ra \; // \; (Ra' + 2 \cdot Rb))}{Ra' + 2 \cdot Rb}$$

$$\gamma_1 = VH - \frac{VLB \cdot (Ra' \; // \; (Ra' + 2 \cdot Rb))Ra'}{(Ra' + 2 \cdot Rb) \cdot (Ra + Ra' \; // \; (Ra' + 2 \cdot Rb))}$$

Expressions (6) and (9) are solved simultaneously, thereby obtaining the following Expressions (10) and (11).

$$VH' = \frac{\frac{\gamma_0}{\beta_0} - \frac{\gamma_1}{\beta_1}}{\frac{\alpha_0}{\beta_0} - \frac{\alpha_1}{\beta_1}} \tag{10}$$

$$Ia' = \frac{\frac{\gamma_0}{\alpha_0} - \frac{\gamma_1}{\alpha_1}}{\frac{\beta_1}{\alpha_1} - \frac{\beta_0}{\alpha_0}} \tag{11}$$

With the driver comparator circuit 100 shown in FIG. 1, when the first voltage VH' and the tail current Ia' together satisfy Expressions (10) and (11), the driver comparator circuit 100 shown in FIG. 1 generates the signal Vdp having the same amplitude as that of the signal generated by the driver comparator circuit 300 shown in FIG. 3. In other words, there is no difference between the driver comparator circuit 100 and the driver comparator circuit 300 as viewed from the second device 102.

Figure 7:
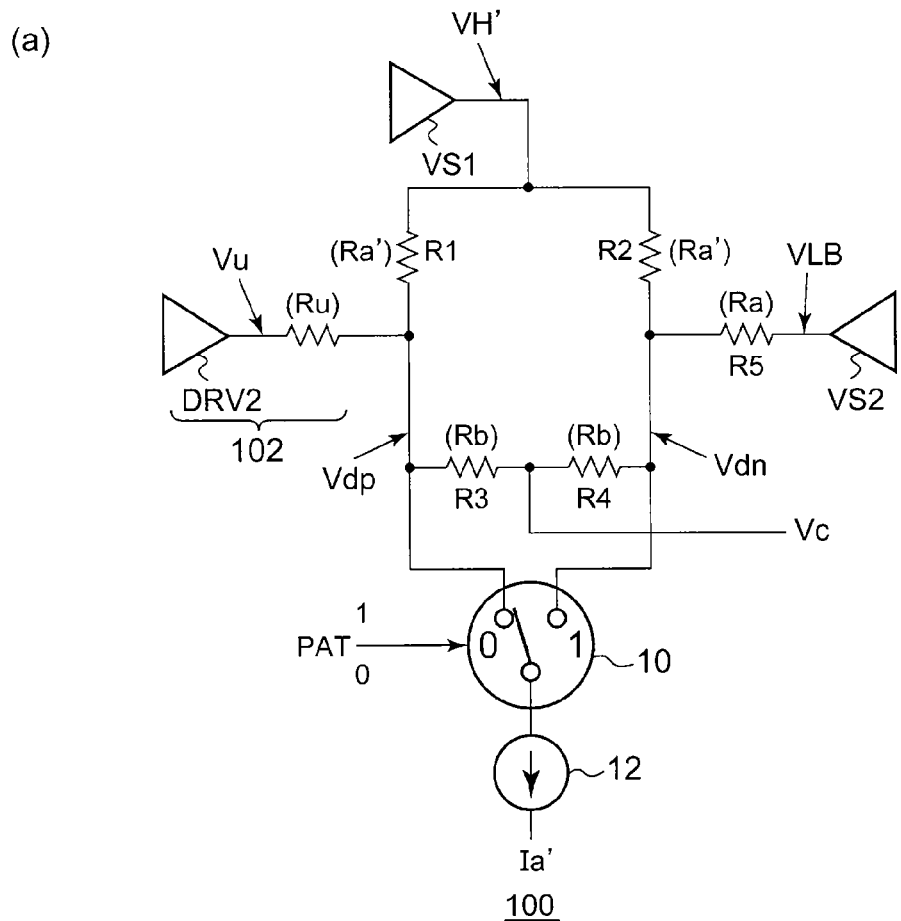
FIGS. 7A and 7B are circuit diagrams each showing a portion of the driver comparator circuit connected to a second device.
Figure 7:
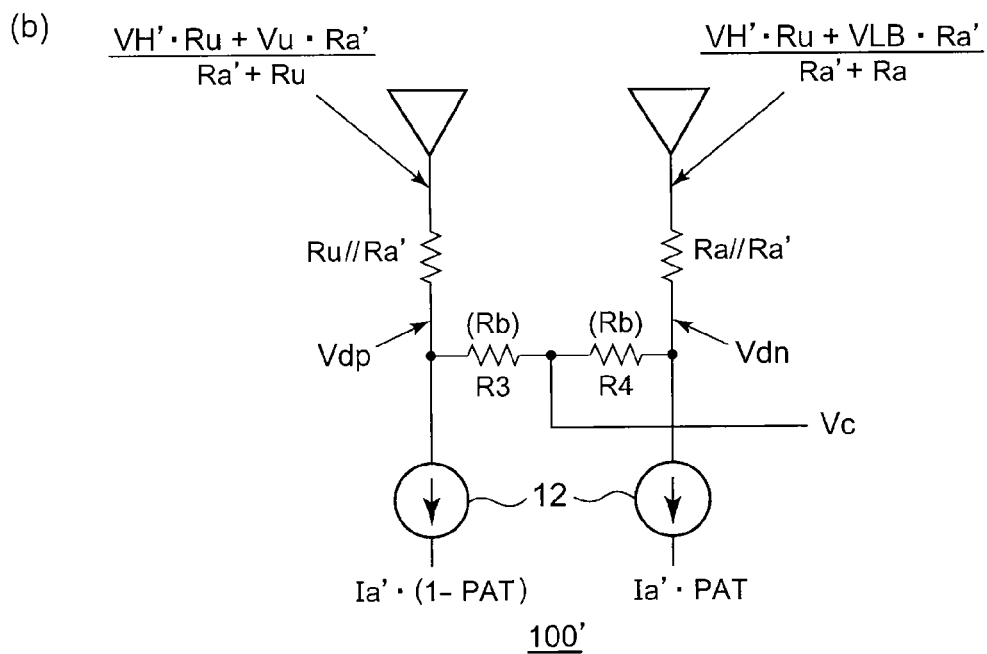

Next, description will be made regarding the input voltage Vc of the comparator CMP1. FIG. 7A is a circuit diagram which shows a portion of the driver comparator circuit 100 connected to the second device 102. FIG. 7B is a modification of the driver comparator circuit 100 shown in FIG. 7A. With regard to FIG. 7B, when the circuit equation is solved with Ra=Ru, the input voltage Vc of the comparator CMP1 is calculated as represented by the following Expression (12).

$$Vc = \frac{(Vu + VLB) \cdot Ra'}{2 \cdot (Ra' + Ra)} - \frac{Ra \cdot Ia'}{2} \cdot \left(1 - \frac{Rb}{Ra' \; // \; Ra + 2 \cdot Rb}\right) \tag{12}$$

The voltage Vc represented by Expression (12) does not contain the PAT term. This ensures that the output signal of the driver amplifier DRV1 does not affect the level judgment made by the comparator CMP1.

By replacing Vu in Expression (12) with VOH, the threshold voltage VOH' shown in FIG. 1 can be determined by the following Expression (13).

$$VOH' = \frac{(VOH + VLB) \cdot Ra'}{2 \cdot (Ra' + Ra)} - \frac{Ra \cdot Ia'}{2} \cdot \left(1 - \frac{Rb}{Ra' \; // \; Ra + 2 \cdot Rb}\right) \tag{13}$$

Description has been made regarding the configuration and the operation of the driver comparator circuit 100 according to the present embodiment. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

[First Modification]

Figure 8:
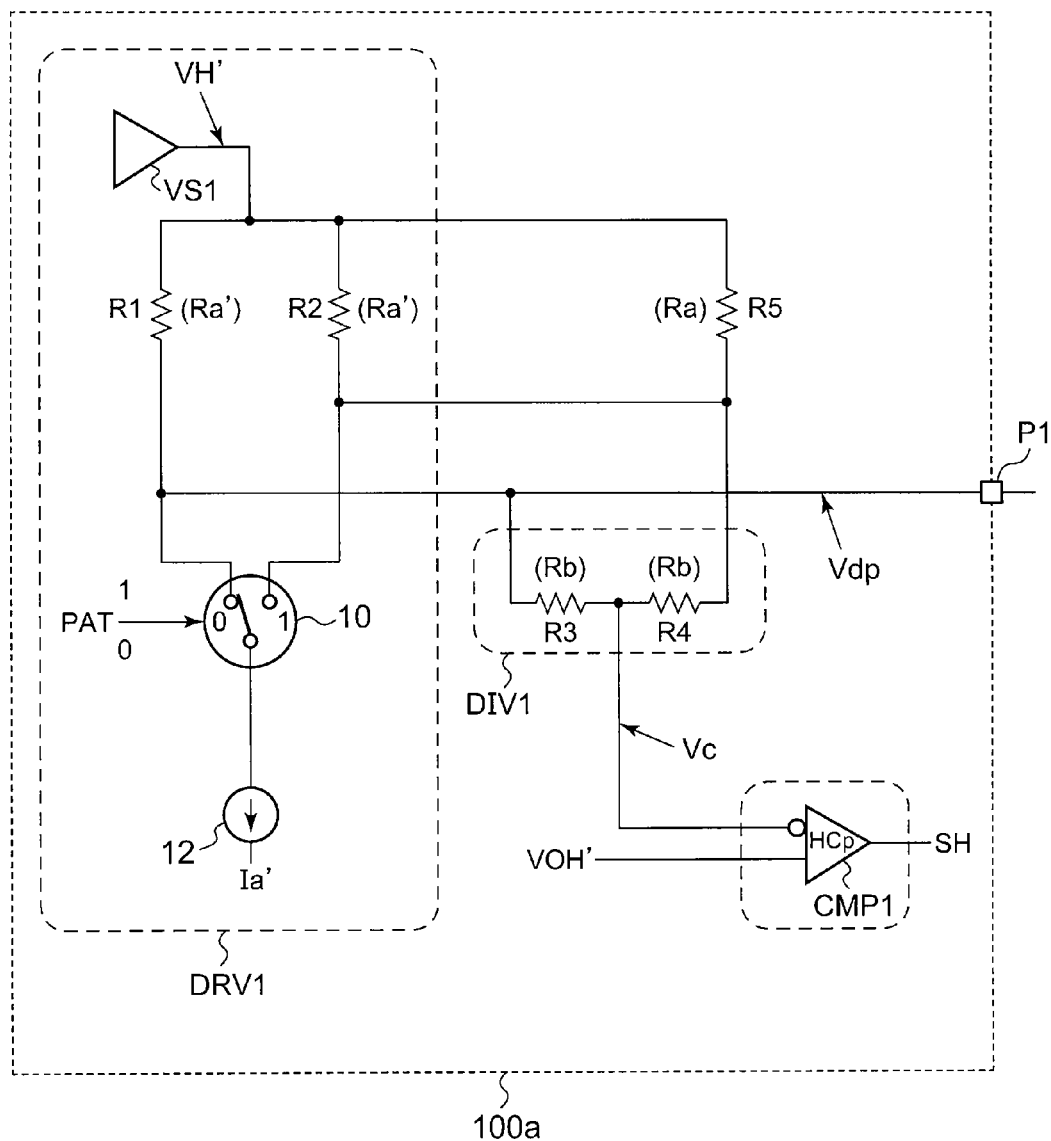
FIG. 8 is a circuit diagram which shows a configuration of a driver comparator circuit according to a first modification.

FIG. 8 is a circuit diagram which shows the configuration of a driver/comparator circuit 100a according to a first modification. With such a modification, the second voltage VLB is the same as the first voltage VH'. Thus, the first resistor R1, the second resistor R2, and the third resistor R3 each receive the voltage VH' via the first terminals thereof from the common voltage source VS1. With such a modification, the second voltage source VS2 can be eliminated.

With such a modification, the respective parameters must satisfy relation equations that further include the constraint condition VLB=VH', in addition to the relation equations obtained in the driver comparator circuit 100 described above with reference to FIG. 1.

[Second Modification]

Figure 9:
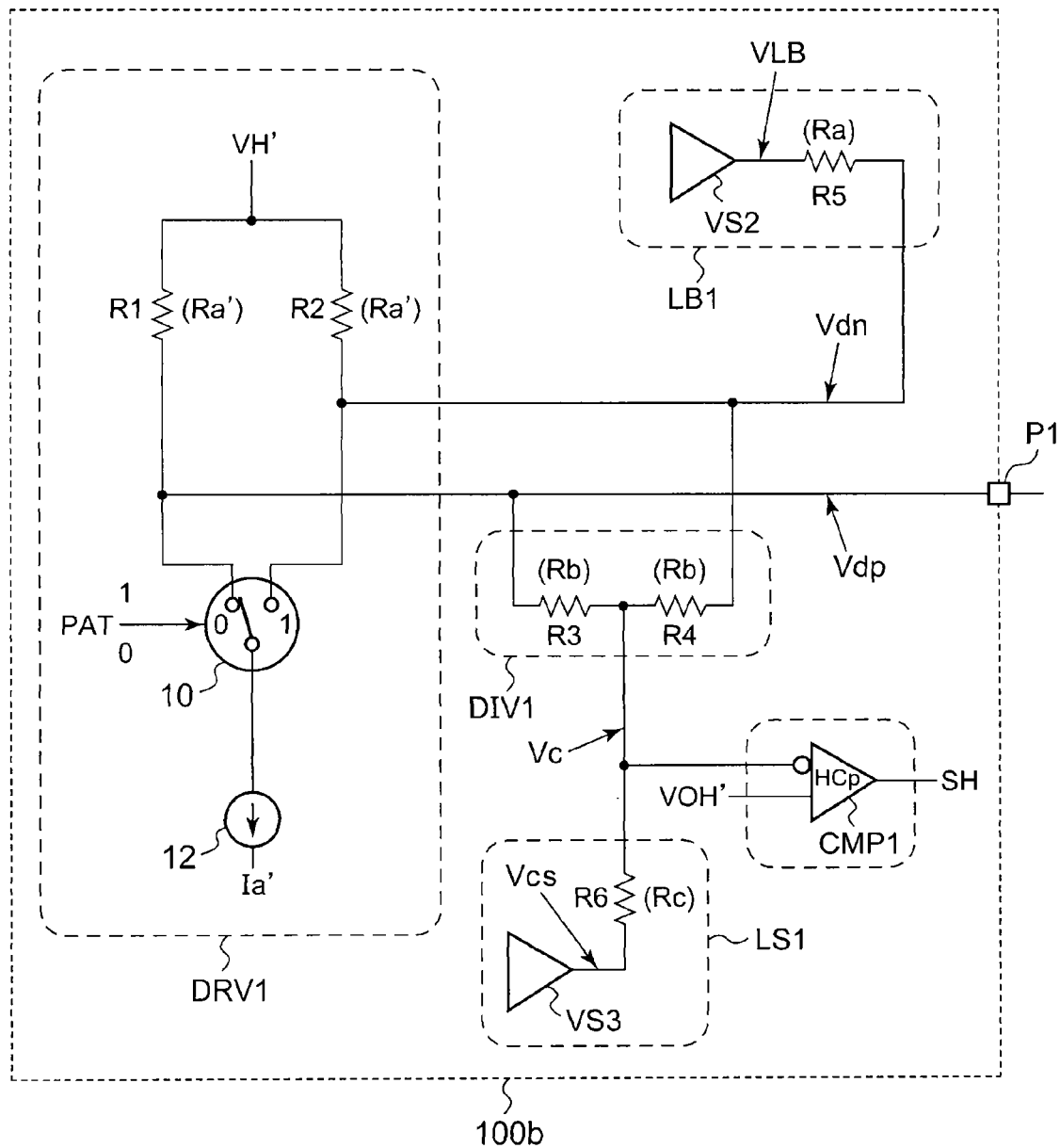
FIG. 9 is a circuit diagram which shows a configuration of a driver comparator circuit according to a second modification.

FIG. 9 is a circuit diagram which shows a driver comparator circuit 100b according to a second modification. This modification further includes a level shifter circuit LS1 configured to level-shift the input voltage Vc of the comparator CMP1, in addition to the components of the driver comparator circuit 100 shown in FIG. 1.

The level shifter circuit LS1 includes a sixth resistor R6 and a third voltage source VS3. The third voltage source VS3 generates a predetermined third voltage Vcs. One terminal (first terminal) of the sixth resistor R6 is connected to a connection node (i.e., the input terminal of the comparator CMP1) that connects the third resistor R3 and the fourth resistor R4. The third voltage Vcs is applied to the other terminal (second terminal) of the sixth resistor R6. The resistance value of the sixth resistor R6 will be represented by "Rc".

The input voltage Vc of the comparator CMP1 is level-shifted by the level shifter circuit LS1. By employing the level shifter circuit LS1, such an arrangement is capable of adjusting the input voltage Vc of the comparator CMP1 to be a suitable value even if a comparator having a narrow allowable input voltage range is employed as the comparator CMP1.

The first requirement is applied to the modification shown in FIG. 9, thereby obtaining the following Expression (14).

$$Ra'/\{(Ra'//Ra+Rb)//Rc+Rb)\}=Ra \quad (14)$$

Expression (14) is solved for Ra', thereby obtaining the following Expression (15). Expression (15) is a relation equation which the resistance values of the resistors included in the driver comparator circuit 100b shown in FIG. 9 must satisfy.

$$Ra' = \frac{Ra^2 \cdot (Rb+Rc) + Ra \cdot \sqrt{\begin{array}{c}Ra^2 \cdot Rc^2 + 4 \cdot Rb^2 \cdot \\ Rc \cdot (Rb+Rc) + Rb^4\end{array}}}{2 \cdot Rc \cdot Rb - Ra^2 + Rb^2} \quad (15)$$

The second requirement is applied to the modification shown in FIG. 9, thereby obtaining the following Expressions (16) and (17).

$$VH' \cdot \alpha_0 - Ia' \cdot \beta_0 = \gamma_0 \quad (16)$$

$$VH' \cdot \alpha_1 - Ia' \cdot \beta_1 = \gamma_1 \quad (17)$$

$$\alpha_0 = \frac{\frac{Ra \cdot Rc \cdot Ra'}{(Ra'//Ra+Rb+Rc)\cdot(Ra+Ra)} + \frac{(Ra'//Ra+Rb)//}{Rc+Rb}}{Ra' + (Ra'//Ra+Rb)//Rc+Rb}$$

$$\beta_0 = Ra$$

$$\gamma_0 = VH - Ia \cdot Ra - \frac{\frac{VLB \cdot Ra' \cdot Rc}{Ra+Ra'} + Vcs \cdot (Ra'//Ra+Rb)}{(Ra' + (Ra'//Ra+Rb)//Rc+Rb) \cdot} \cdot Ra'$$
$$(Ra'//Ra+Rb+Rc)$$

$$\alpha_1 = \frac{\left(\frac{\frac{Ra \cdot (Rc//(Ra'+Rb)+Rb)}{Ra+Ra'} +}{\frac{Rc \cdot (Ra//Ra')}{Ra'+Rb+Rc}}\right) \cdot Rc \cdot Ra'}{(Rb+Rc)\cdot(Rc//(Ra'+Rb)+Rb+Ra//Ra')} + \frac{Rb//}{Rc+Rb}$$

$$\beta_1 = \frac{(Ra//Ra')//(Rc//(Ra'+Rb)+Rb)\cdot Rc \cdot Ra}{(Rb+Rc)\cdot(Ra'+Rb+Rb//Rc)}$$

$$\gamma_1 = $$

$$VH - \frac{\left(\frac{VLB \cdot Ra' \cdot (Rc//(Ra'+Rb)+Rb)}{Ra+Ra'} + \frac{Vcs \cdot (Ra'+Rb)\cdot(Ra//Ra')}{Ra'+Rb+Rc}\right) \cdot Rc + Vcs \cdot Rb}{(Ra'+Rb+Rb//Rc)\cdot(Rb+Rc)} \cdot Ra'$$

VH' and Ia' can be calculated using the aforementioned Expressions and the Expressions (10) and (11). Furthermore, the following Expression (18) is obtained using the Expression (12).

$$Vc = \frac{2}{2 \cdot Rc + Ra'//Ra+Rb} \times \left[\begin{array}{c}\left\{\frac{2 \cdot VH' \cdot Ra + (Vu+VLB)\cdot Ra'}{2\cdot(Ra'+Ra)} - \right. \\ \left.\frac{Ra \cdot Ia'}{2} \cdot \left(1 - \frac{Rb}{Ra'//Ra+2\cdot Rb}\right)\right\} \cdot \\ Rc + Vcs \cdot \frac{Ra'//Ra+Rb}{2}\end{array}\right] \quad (18)$$

Vu in Expression (18) is replaced with VOH, thereby obtaining the threshold voltage VOH'.

[Third Modification]

FIGS. 10A and 10B are circuit diagrams which show the configuration of a driver comparator circuit 100c according to a third modification. In FIG. 10A, at least one of a termination circuit (terminator) 20a including the first voltage source VS1 and the first resistor R1, a termination circuit 20b including the first voltage source VS1 and the second resistor R2, and a termination circuit 20c configured as a load balancer LB1 has a configuration of a termination circuit 20 shown in FIG. 10B.

As shown in FIG. 10B, the termination circuit 20 includes a Thevenin termination circuit 22 and an R-2R termination circuit 24, the output terminals of which are connected so as to form a common terminal.

Figure 10:
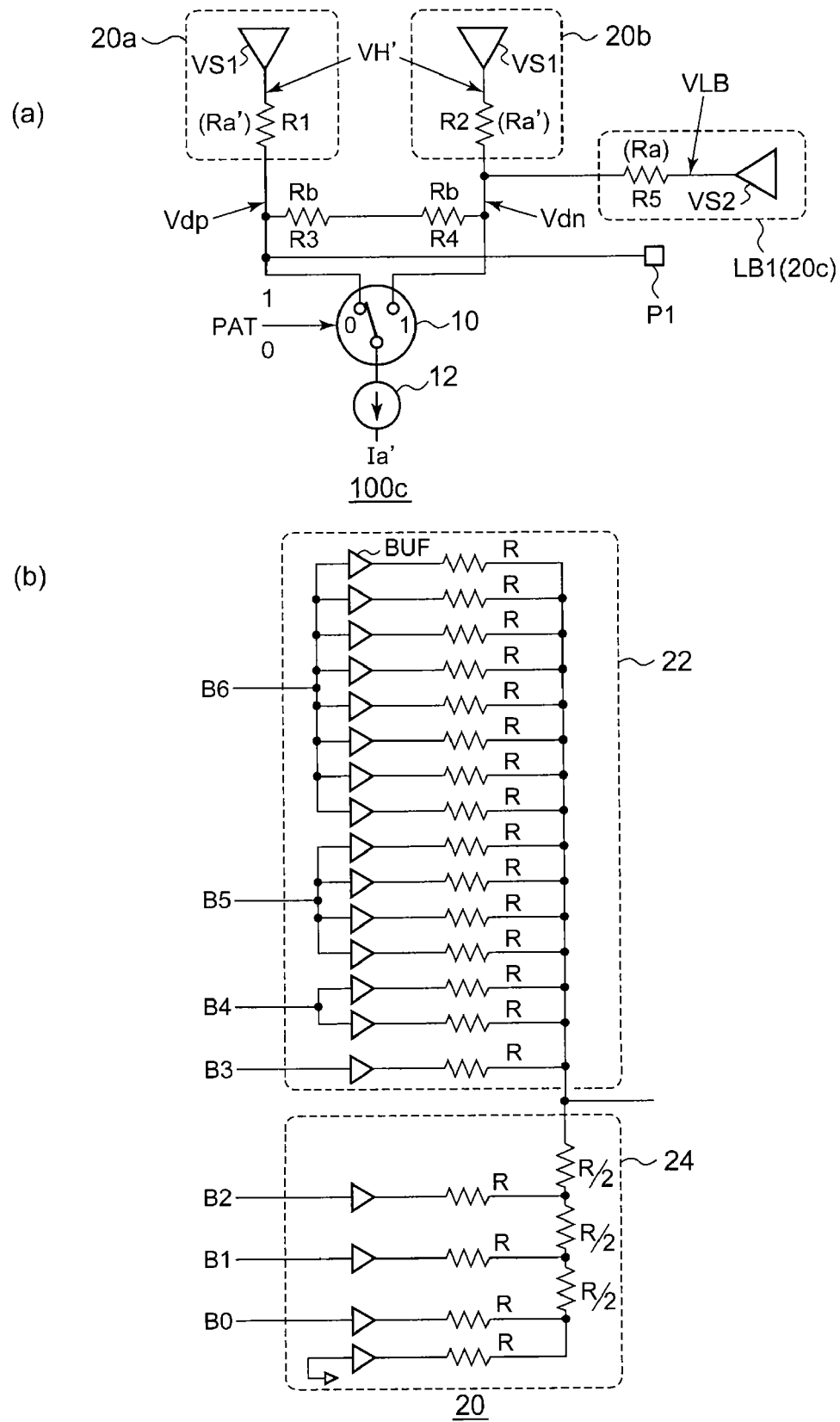
FIGS. 10A and 10B are circuit diagrams which show a configuration of a driver comparator circuit according to a third modification.

The termination circuit 20 is controlled according to (K+L)-bit (K and L are integers) digital control data B. The higher order K bits of the control data B are assigned to the Thevenin termination circuit 22, and the lower order L bits are assigned to the R-2R termination circuit 24. FIG. 10 shows an arrangement in which K=4, and L=3.

The Thevenin termination circuit 22 includes $\Sigma_{i=1:K} 2^{i-1}$ (=$2^K$−1) pairs of a buffer BUF and a resistor R connected in parallel. "$\Sigma_{i=1:K}$" represents addition of a variable i while i is incremented from 1 to K. The buffer-resistor pairs are grouped into K groups. The buffer-resistor pairs that belong to the same group are arranged such that the input terminals thereof are connected so as to form a common input terminal and such that the output terminals thereof are connected so as to form a common output terminal. Furthermore, the i-th (1≦i≦K) group includes $2^{i-1}$ buffer-resistor pairs. The i-th group receives, as an input signal, the lower (i+L)-bit data of the control data, i.e., B[i+L]. The output terminals of all the buffer-resistor pairs are connected so as to form a common output terminal.

The R-2R termination circuit 24 includes an (L+1)-stage R-2R network and (L+1) buffers each of which is arranged to apply voltage to one terminal of the resistor R of the corresponding stage. The lower order L bits of the control data B are assigned to the buffers in the order of closeness to the output terminal. A fixed electric potential (e.g., ground potential) is input to the buffer farthest from the output terminal.

Such a modification shown in FIG. 10 is capable of suitably controlling the first voltage VH' and the second voltage LB shown in FIG. 1 etc., and the third voltage Vcs shown in FIG. 9 according to the control bit B[6:0].

With the modification shown in FIG. 10, the internal impedance of the Thevenin termination circuit 22 as viewed from the output terminal thereof is represented by R/($2^k$−1). Furthermore, the internal impedance of the R-2R termination circuit 24 as viewed from the output terminal thereof is represented by R.

The internal impedance of the termination circuit 20 as viewed from the output terminal thereof is calculated as the combined impedance obtained by combining the impedances of the Thevenin termination circuit 22 and the R-2R termination circuit 24, which is represented by R/2$^k$. Accordingly, the resistances R and R/2 should be determined such that the combined impedance thus obtained matches the resistance value Ra', Ra, or Rc.

While the preferred embodiments of the present invention have been described using specific terms, such description is for illustrative purposes only, and it is to be understood that changes and variations may be made without departing from the spirit or scope of the appended claims.

What is claimed is:

1. A driver comparator circuit configured to provide bidirectional signal transmission with a communication target device via a transmission line, the driver comparator circuit comprising:
   an input/output terminal connected to the transmission line;
   a first resistor arranged such that a first voltage is applied to a first terminal thereof, and a second terminal thereof is connected to the input/output terminal;
   a second resistor arranged such that the first voltage is applied to a first terminal thereof;
   a tail current source configured to generate a predetermined tail current;
   a current switch configured to receive data to be transmitted to the communication target device, to select one terminal from among the second terminal of the first resistor and a second terminal of the second resistor according to the value of the data thus received, and to connect the second terminal thus selected to the tail current source;
   a voltage dividing circuit including a third resistor and a fourth resistor provided in series between the second terminal of the first resistor and the second terminal of the second resistor;
   a load balancer including a fifth resistor arranged such that a second voltage is applied to a first terminal thereof, and a second terminal thereof is connected to the second terminal of the second resistor; and
   a comparator configured to compare the electric potential at a connection node that connects the third and fourth resistors with a predetermined first threshold voltage.

2. A driver comparator circuit according to claim 1, wherein the resistance value Ra' of each of the first and second resistors, the resistance value Rb of each of the third and fourth resistors, and the resistance value Ra of the fifth resistor satisfy the following Expression (1).

$$Ra' = \frac{Ra}{2} \cdot \left( \frac{Ra}{Rb} + \sqrt{\frac{Ra^2}{Rb^2} + 4} \right) \quad (1)$$

3. A driver comparator circuit according to claim 1, wherein the first voltage is equal to the second voltage,
   and wherein the first, second, and third resistors each receive a voltage from a common voltage source via the first terminals thereof.

4. A driver comparator circuit according to claim 1, wherein the second voltage is approximately the same as the average value of the voltage output from the communication target device.

5. A driver comparator circuit according to claim 1, further comprising a sixth resistor arranged such that a first terminal thereof is connected to a connection node that connects the third and fourth resistors, and a predetermined third voltage is applied to a second terminal thereof.

6. A driver comparator circuit according to claim 5, wherein the resistance value Ra' of each of the first and second resistors, the resistance value Rb of each of the third and fourth resistors, the resistance value Ra of the fifth resistor, and the resistance value Rc of the sixth resistor satisfy the following Expression (2).

$$Ra' = \frac{Ra^2 \cdot (Rb + Rc) + Ra \cdot \sqrt{\frac{Ra^2 \cdot Rc^2 + 4 \cdot Rb^2 \cdot}{Rc \cdot (Rb + Rc) + Rb^4}}}{2 \cdot Rc \cdot Rb - Ra^2 + Rb^2} \quad (2)$$

7. A driver comparator circuit according to claim 1, wherein at least one of the first, second, and third resistors is replaced with a Thevenin termination circuit and an R-2R termination circuit that includes an R-2R resistor network, arranged such that output terminals thereof are connected so as to form a common output terminal.

8. A test apparatus configured to provide bidirectional signal transmission with a device under test via a transmission line so as to test the device under test, the test apparatus comprising a driver comparator circuit according to claim 1, configured to communicate with the device under test as a communication target.

* * * * *